(12) United States Patent
Thijs et al.

(10) Patent No.: US 9,817,202 B2
(45) Date of Patent: *Nov. 14, 2017

(54) UNIVERSAL CABLE MANAGEMENT SYSTEM FOR TELECOMMUNICATIONS RACK

(71) Applicant: CommScope Connectivity Belgium BVBA, Kessel-Lo (BE)

(72) Inventors: Danny Ghislain Thijs, Zonhoven (BE); Heidi Bleus, Genk (BE); Willem De Vis, Merchtem (BE)

(73) Assignee: COMMSCOPE CONNECTIVITY BELGIUM BVBA (BE)

( * ) Notice: Subject to any disclaimer, the term of this patent is extended or adjusted under 35 U.S.C. 154(b) by 0 days.

This patent is subject to a terminal disclaimer.

(21) Appl. No.: 15/162,191

(22) Filed: May 23, 2016

(65) Prior Publication Data
US 2017/0023760 A1    Jan. 26, 2017

Related U.S. Application Data

(63) Continuation of application No. 14/102,035, filed on Dec. 10, 2013, now Pat. No. 9,348,014.
(Continued)

(51) Int. Cl.
*G02B 6/00*    (2006.01)
*G02B 6/44*    (2006.01)
(Continued)

(52) U.S. Cl.
CPC ......... *G02B 6/4471* (2013.01); *G02B 6/4452* (2013.01); *G02B 6/46* (2013.01);
(Continued)

(58) Field of Classification Search
CPC .... G02B 6/4471; G02B 6/4452; G02B 6/444; H04Q 1/023; H04Q 1/09; H05K 7/186; Y10T 29/49117
(Continued)

(56) References Cited

U.S. PATENT DOCUMENTS 5,450,272 A * 9/1995 Van Gaal ............... H04Q 1/10
                                                    361/690
5,689,604 A * 11/1997 Janus .................... G02B 6/4441
                                                    385/134
(Continued)

FOREIGN PATENT DOCUMENTS

EP          1 021 050 A1    7/2000
WO    WO 2009/058928 A1    5/2009

OTHER PUBLICATIONS

International Search Report and Written Opinion for PCT/EP2013/076157 dated May 13, 2014.

*Primary Examiner* — Kaveh C Kianni
*Assistant Examiner* — Guy Anderson
(74) *Attorney, Agent, or Firm* — Merchant & Gould P.C.

(57) ABSTRACT

A telecommunications cable management assembly (100) for a distribution frame (10) is disclosed. The cable management assembly (100) includes a front plate (110) extending between first and second ends (110a, 110c) and is provided with apertures (112) for mounting telecommunications components (20). A first side bracket (120) is mounted with the first end (110a) of the front plate (110) to the distribution frame (10). The first side bracket (120) supports cables (26) extending laterally from components (20). A second side bracket (130) is mounted with the second end (110c) of the front plate (110) to the distribution frame (10). The second side bracket (130) can also support cables (28) extending laterally from components (20).

10 Claims, 11 Drawing Sheets

Related U.S. Application Data

(60) Provisional application No. 61/735,817, filed on Dec. 11, 2012.

(51) Int. Cl.
*G02B 6/46* (2006.01)
*H04Q 1/02* (2006.01)
*H05K 7/18* (2006.01)

(52) U.S. Cl.
CPC .............. *H04Q 1/023* (2013.01); *H04Q 1/09* (2013.01); *H05K 7/186* (2013.01); *G02B 6/444* (2013.01); *G02B 6/4439* (2013.01); *Y10T 29/49117* (2015.01)

(58) Field of Classification Search
USPC .................................................. 385/134–139
See application file for complete search history.

(56) References Cited

U.S. PATENT DOCUMENTS

| | | | | |
|---|---|---|---|---|
| 5,806,687 | A * | 9/1998 | Ballesteros | H04Q 1/09 211/169 |
| 6,600,106 | B2 | 7/2003 | Standish et al. | |
| 6,692,162 | B2 * | 2/2004 | Glynn | G02B 6/4452 385/135 |
| 6,728,461 | B1 * | 4/2004 | Senatore | G02B 6/4471 385/135 |
| 6,870,095 | B1 * | 3/2005 | Whitted | H04Q 1/066 174/135 |
| 7,039,291 | B1 * | 5/2006 | Georgiano | G02B 6/444 220/4.01 |
| 7,091,418 | B1 | 8/2006 | Clark et al. | |
| 7,187,265 | B1 * | 3/2007 | Senogles | G06F 1/181 211/26 |
| 7,200,931 | B2 | 4/2007 | Clark et al. | |
| 7,357,667 | B2 | 4/2008 | Clark et al. | |
| 7,455,548 | B2 | 11/2008 | Clark et al. | |
| 7,479,032 | B2 | 1/2009 | Hoath et al. | |
| 7,522,804 | B2 * | 4/2009 | Araki | G02B 6/4452 385/134 |
| 7,607,938 | B2 | 10/2009 | Clark et al. | |
| 7,641,513 | B2 | 1/2010 | Hoath et al. | |
| 7,787,260 | B2 | 8/2010 | Hruby et al. | |
| 7,811,122 | B2 | 10/2010 | Clark et al. | |
| 7,811,123 | B2 | 10/2010 | Hoath et al. | |
| 7,817,444 | B2 | 10/2010 | Dennes | |
| 7,945,136 | B2 * | 5/2011 | Cooke | G02B 6/4471 385/135 |
| 7,986,864 | B2 * | 7/2011 | Naudin | G02B 6/4452 385/135 |
| 7,995,357 | B2 | 8/2011 | Hruby et al. | |
| 8,040,692 | B2 | 10/2011 | Hetzer et al. | |
| 8,285,104 | B2 * | 10/2012 | Davis | G02B 6/4471 385/135 |
| 8,290,330 | B2 | 10/2012 | Taylor et al. | |
| 8,410,364 | B2 * | 4/2013 | Dunwoody | H05K 7/1491 174/68.1 |
| 8,422,847 | B2 * | 4/2013 | Kowalczyk | G02B 6/4453 385/134 |
| 8,520,408 | B2 | 8/2013 | Hruby et al. | |
| 8,528,872 | B2 * | 9/2013 | Mattlin | G06F 1/181 211/192 |
| 8,565,572 | B2 * | 10/2013 | Krampotich | G02B 6/4452 385/135 |
| 8,750,669 | B2 * | 6/2014 | Carter | H04Q 1/09 385/100 |
| 8,938,147 | B2 * | 1/2015 | Krampotich | G02B 6/4452 385/135 |
| 9,348,104 | B2 | 5/2016 | Thijs et al. | |
| 2004/0013387 | A1 * | 1/2004 | Wakileh | G02B 6/4455 385/134 |
| 2004/0257766 | A1 * | 12/2004 | Rasmussen | H05K 7/20572 361/689 |
| 2008/0302922 | A1 | 12/2008 | Pepe et al. | |
| 2009/0179116 | A1 | 7/2009 | St-Louis et al. | |
| 2009/0257726 | A1 * | 10/2009 | Redmann | G02B 6/4452 385/135 |
| 2010/0054684 | A1 * | 3/2010 | Cooke | G02B 6/4455 385/135 |
| 2010/0183270 | A1 * | 7/2010 | Davis | G02B 6/4471 385/100 |
| 2010/0202744 | A1 * | 8/2010 | Douglas | G02B 6/4452 385/135 |
| 2010/0322578 | A1 * | 12/2010 | Cooke | G02B 6/4471 385/135 |
| 2011/0280537 | A1 * | 11/2011 | Cowen | G02B 6/4471 385/135 |
| 2011/0317974 | A1 * | 12/2011 | Krampotich | G02B 6/4452 385/135 |
| 2012/0288249 | A1 * | 11/2012 | Ruiz | H04Q 1/02 385/135 |
| 2013/0170810 | A1 * | 7/2013 | Badar | G02B 6/4471 385/135 |
| 2014/0178025 | A1 * | 6/2014 | Krampotich | G02B 6/4452 385/135 |

\* cited by examiner

UNIVERSAL CABLE MANAGEMENT SYSTEM FOR TELECOMMUNICATIONS RACK

CROSS REFERENCE TO RELATED APPLICATION

This application is a continuation of application Ser. No. 14/102,035, filed Dec. 10, 2013, now U.S. Pat. No. 9,348,104, which application claims the benefit of provisional application Ser. No. 61/735,817, filed Dec. 11, 2012, and titled "Universal Cable Management System for Telecommunications Rack," which applications are incorporated herein by reference in its entirety.

TECHNICAL FIELD

A cable management system for use with telecommunications racks or cabinets is disclosed.

BACKGROUND

A telecommunications distribution frame can be used to support telecommunication components that are connected to other components via telecommunication cables, such as patch cords. In some applications, multiple rows of patch panels are provided to receive the patch cords that extend from the distribution frame to other system components. It is common for additional cables within the frame to connect to the other side of the patch panels. These additional cables are also generally routed to other system components, which may be within the same distribution frame. It is known to support these additional cables within the frame by a horizontal shelf or bracket corresponding to each patch panel. The cables are attached to the shelf or bracket and act as a strain relief with respect to the cable connection to the patch panel. Where multiple rows of patch panels are provided with such a configuration, multiple shelves are arrayed within the distribution frame resulting in a shelf being present above and/or below each horizontally adjacent patch panel. Due to the presence of multiple horizontal shelves, access to the back side of the patch panels, where the additional cables are connected, can be difficult. Improvements are desired.

SUMMARY

The present disclosure is directed to a telecommunications cable management assembly for a distribution frame. In one embodiment, the cable management assembly includes a front plate extending between first end and a second end with an intermediate point there between. The front plate may be provided with apertures on both sides of the intermediate point for mounting telecommunications components. A first side bracket may be provided that extends between a front end and a back end wherein the first side bracket front end extends from the first end of the front plate and the back end is configured for mounting to the distribution frame. In one embodiment, the first side bracket is configured to support cables extending from telecommunications components mounted to the front plate between the front plate intermediate point and the front plate first end. A second side bracket may be provided that extends between a front end and a back end wherein the second side bracket front end extends from the second end of the front plate and the back end is configured for mounting to the distribution frame. As shown, the second side bracket can be configured to support cables extending from telecommunications components mounted to the front plate between the front plate intermediate point and the front plate second end. It is noted that all of the cables extending from the connectors may be extended laterally over to only one of the first and second side brackets as well.

The first and second side brackets of the cable management assembly may be configured to have an extendable length such that the same assembly can be fitted into a number of different frame assemblies having different depths. As shown, the first and second side brackets each include a sleeve part and an insert part received within the sleeve part wherein the insert part is slidable within the sleeve part. The first and side brackets may also be configured to have an aperture arrangement for accepting cable mounts that support and retain the cables. It is also noted that a plurality of cable management assemblies can be provided in the same distribution frame. The distribution frame may also include other equipment such as active equipment and additional cable management accessories.

A method of supporting cables in a telecommunications distribution frame within which the disclosed cable management assembly is mounted is also disclosed. It is noted that the cables may be of any type, for example, copper cables and/or fiber optic cables. In one step, each of a first plurality of cables is connected to connectors located on the front plate of the cable management assembly. The cables are then laterally routed from the connectors and along the first side bracket wherein the first side bracket extends along a first side of the distribution frame between the front plate first end and a back of the distribution frame. The cables are then secured to the first side bracket. In another step, each of a second plurality of cables is connected to connectors located on the front plate of the cable management assembly. The cables are then routed laterally from the connectors and along the second side bracket, the second side bracket extending along a second side of the distribution frame between the front plate second end and the back of the distribution frame. The cables are then secured to the second side bracket. In contrast to systems that have horizontal shelves, the resulting assembly and configuration provides for easy access to the back of the telecommunications connectors throughout the useful life of the equipment.

BRIEF DESCRIPTION OF THE FIGURES

Non-limiting and non-exhaustive embodiments are described with reference to the following figures, which are not necessarily drawn to scale, wherein like reference numerals refer to like parts throughout the various views unless otherwise specified.

DETAILED DESCRIPTION

Figure 1:
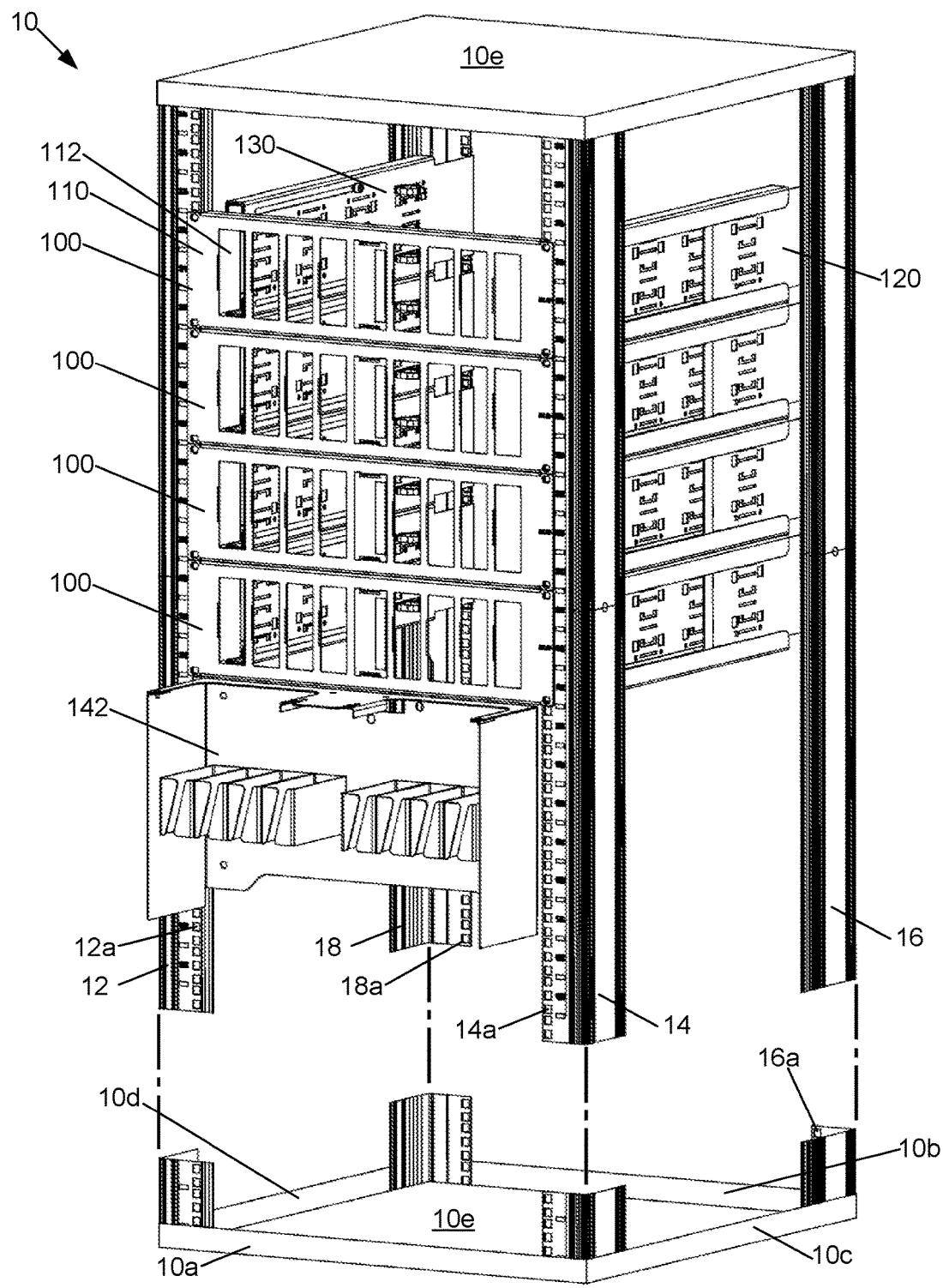
FIG. 1 is a front perspective view of a telecommunications frame incorporating a plurality of cable management assemblies having features that are examples of aspects in accordance with the principles of the present disclosure.
Figure 2:
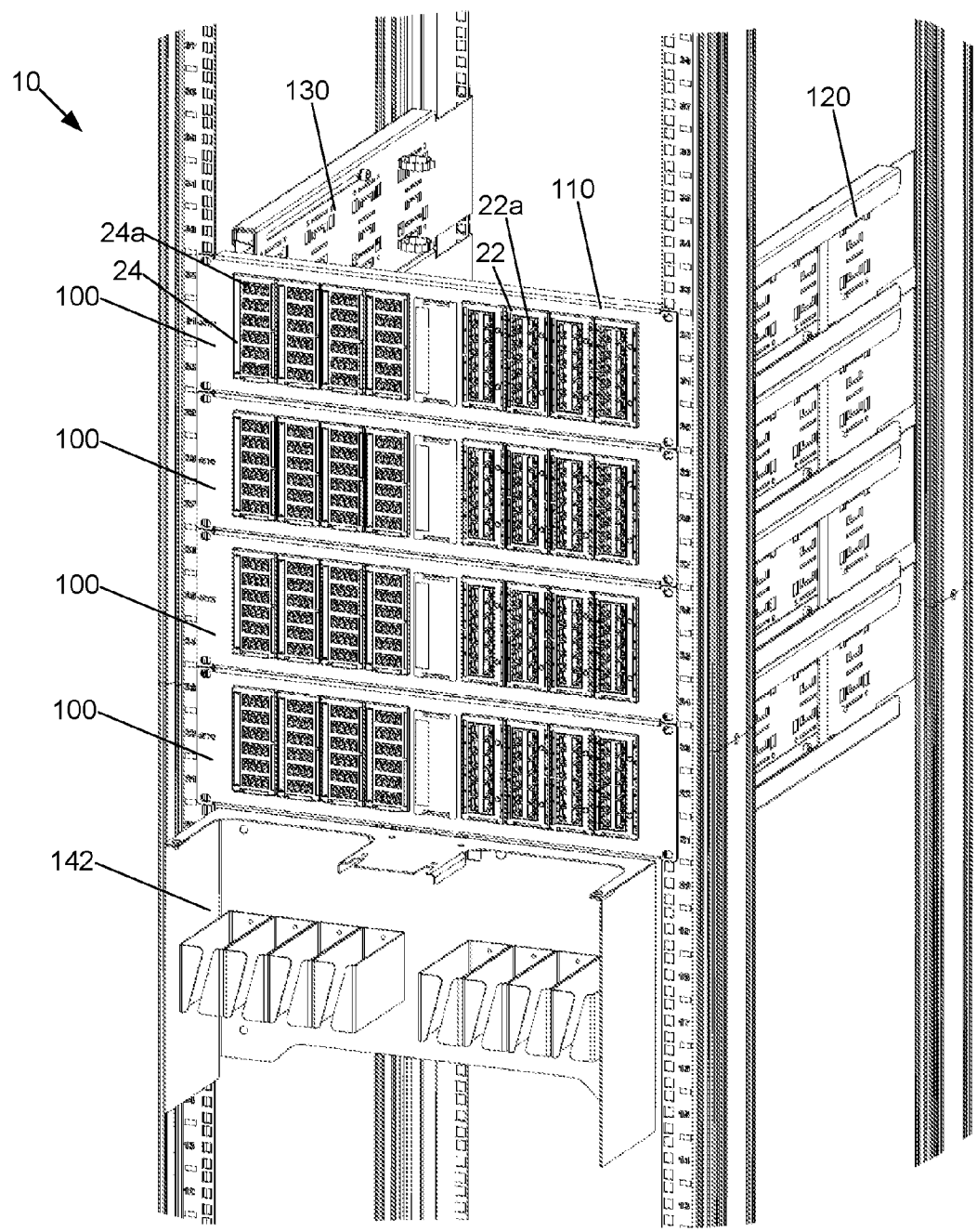
FIG. 2 is a front perspective view of a portion of the telecommunications frame and cable management assemblies of FIG. 1 with the addition of telecommunications connectors and jacks to form patch panels with the cable management assemblies.
Figure 3:
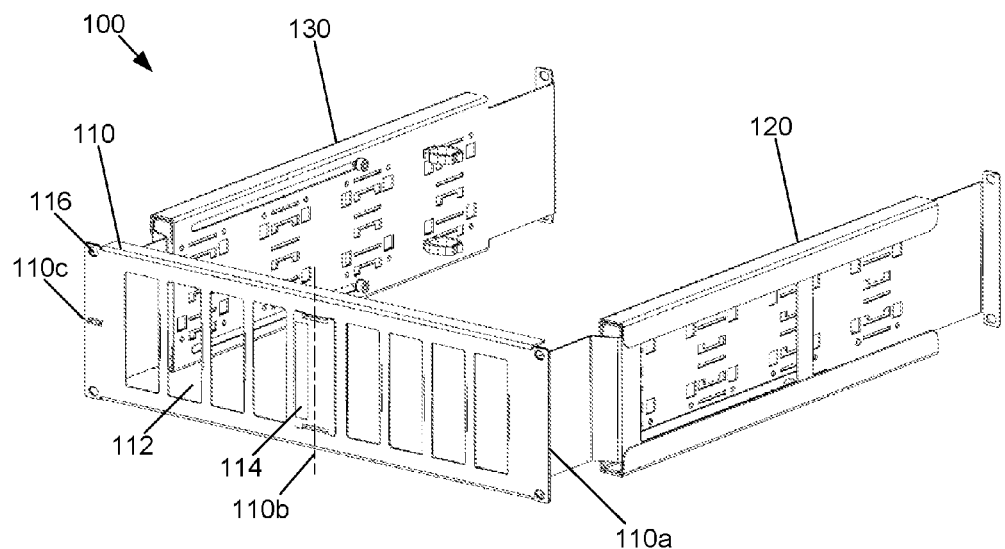
FIG. 3 is a front perspective view of one of the individual cable management assemblies shown in FIG. 1 separated from the telecommunications frame.
Figure 4:
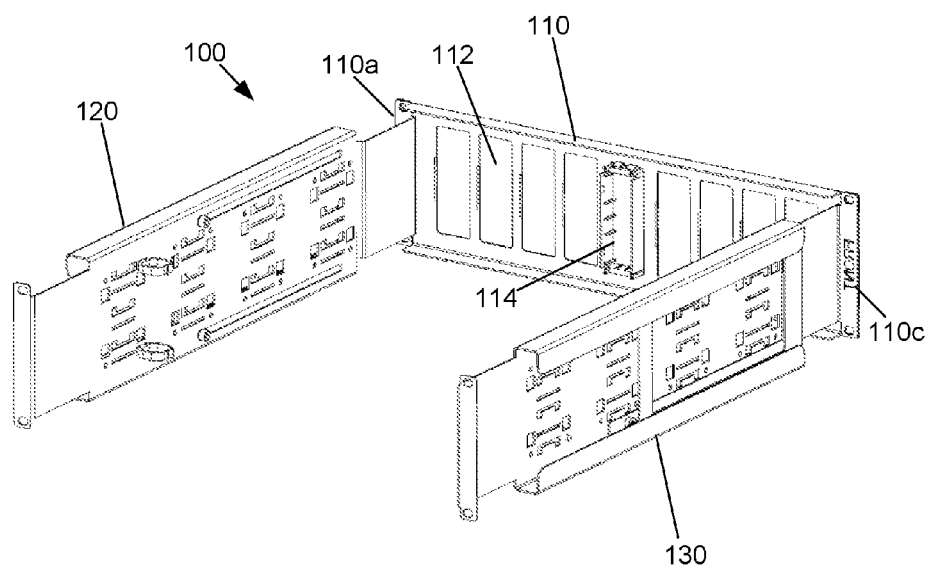
FIG. 4 is a rear perspective view of the cable management assembly shown in FIG. 3.
Figure 5:
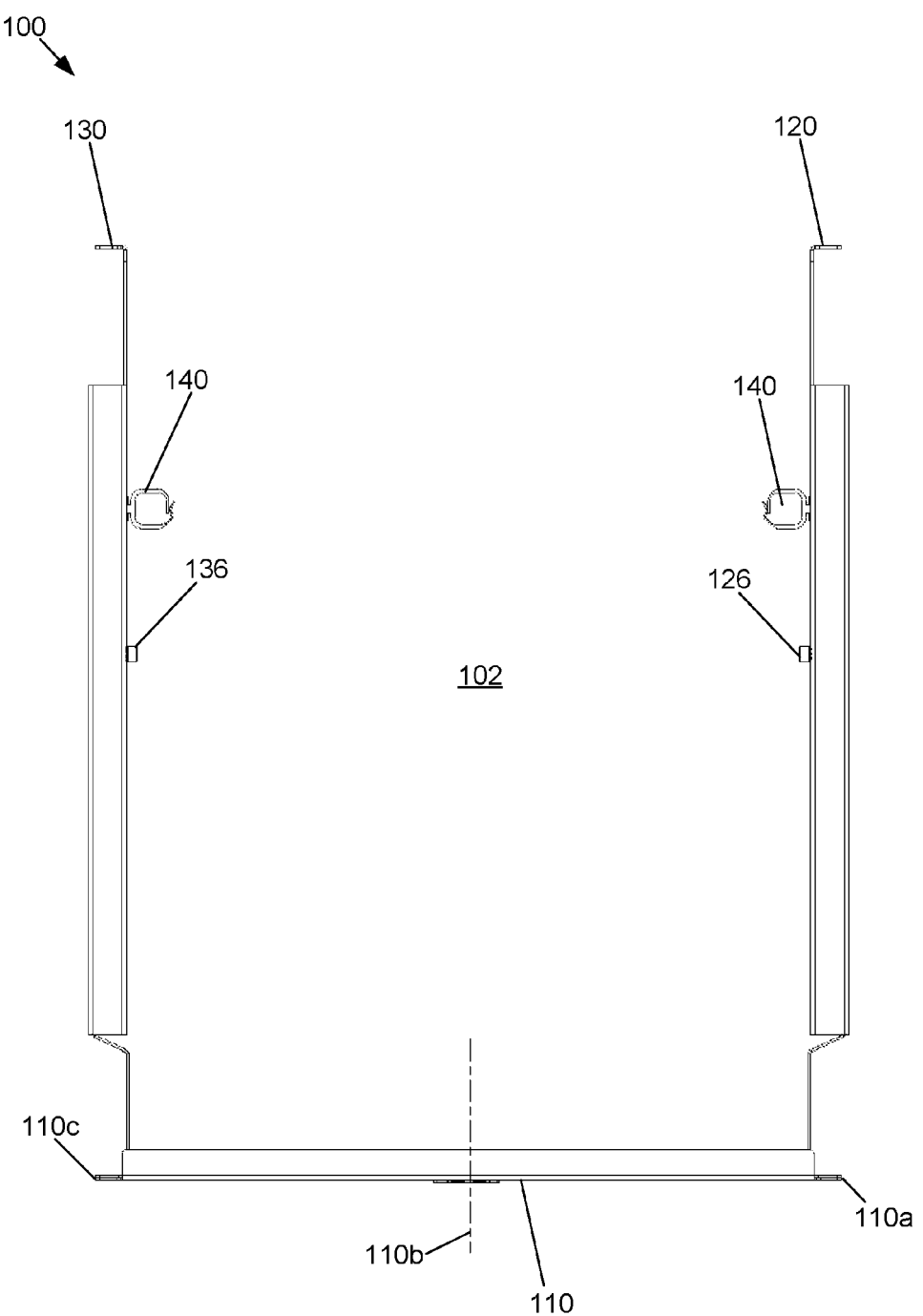
FIG. 5 is a top view of the cable management assembly shown in FIG. 3.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Referring to FIGS. 1, 2 and 13-16 a telecommunications distribution frame and system 10 is shown. As shown, the distribution frame 10 has a front 10a and a back 10b that extend between first and second sides 10c, 10d. The frame 10 is also shown as having a top 10e and a bottom 10f that extend between vertical posts 12, 14, 16, 18. Vertical posts 12, 14, 16, 18 are shown as being formed from generally L-shaped extrusions and are provided with mounting holes 12a, 14a, 16a, 18a for facilitating the mounting of equipment and accessories. In the embodiment shown, the distribution system 10 is an open structure. However, it is noted that front, back, and/or side panels could be provided to form an enclosed cabinet.

Within the distribution frame 10, a plurality of cable management assemblies 100 are shown. The cable management assemblies 100 are for supporting and organizing cables within the distribution frame 10. The distribution frame 10 is also shown as having a vertical cable management accessory 142 mounted to the front of the frame 10 and located below the cable management assemblies 100, the vertical cable management accessory being for routing cables from telecommunications components supported by the cable management assemblies 100 to active equipment (not shown) supported by the frame 10. Frame 10 may be configured to support other types of accessories and equipment as well.

Figure 8:
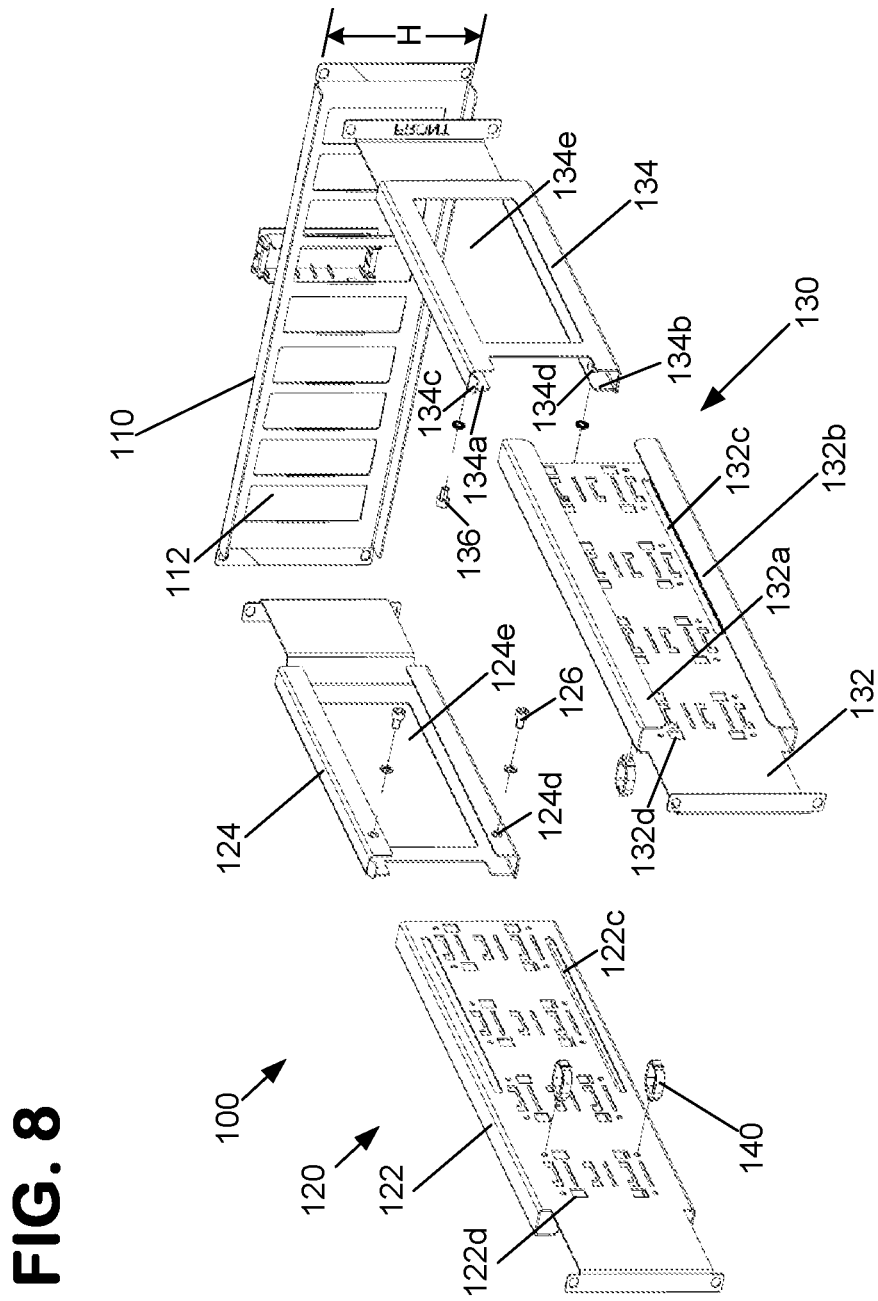
FIG. 8 is an exploded rear perspective view of the cable management assembly shown in FIG. 3.
Figure 9:
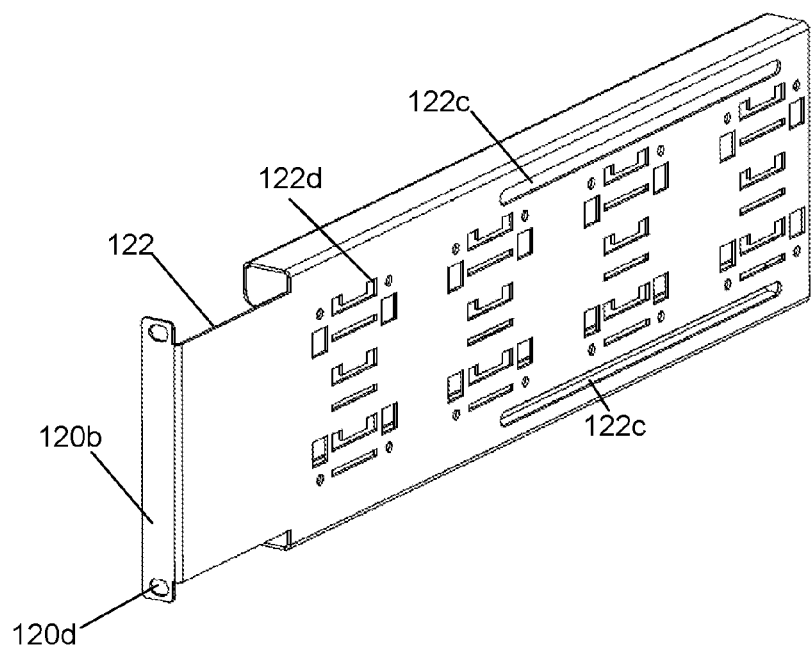
FIG. 9 is a rear perspective view of a side bracket sleeve part of the cable management assembly shown in FIG. 3.
Figure 10:
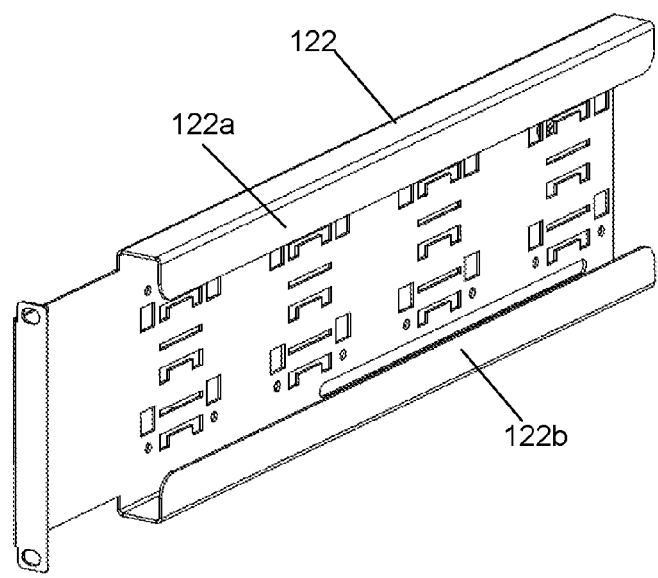
FIG. 10 is a front perspective view of the side bracket sleeve part shown in FIG. 9.
Figure 11:
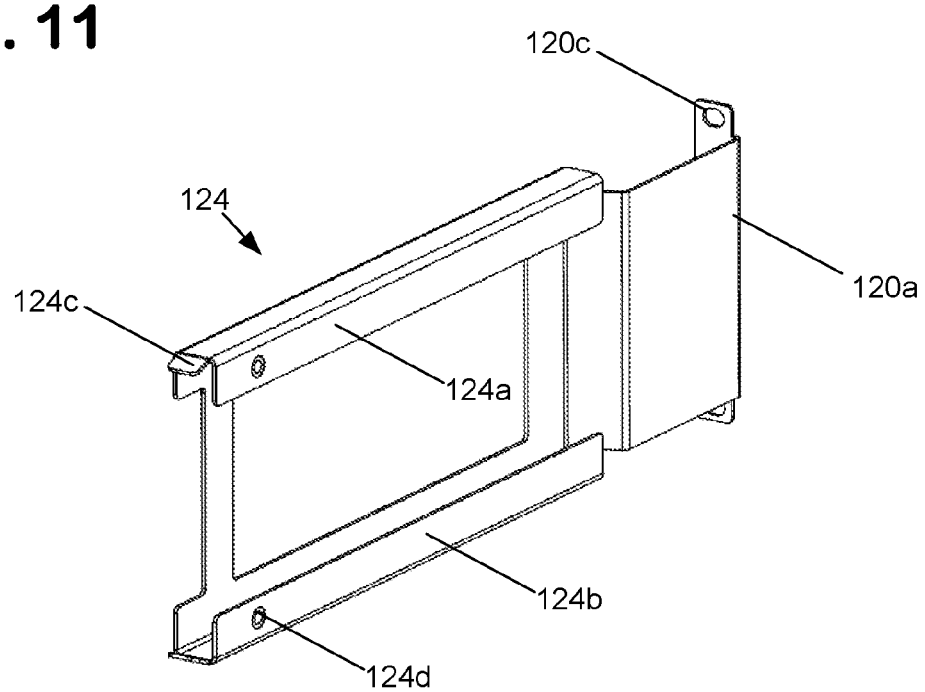
FIG. 11 is a rear perspective view of a side bracket insert part of the cable management assembly shown in FIG. 3.
Figure 12:
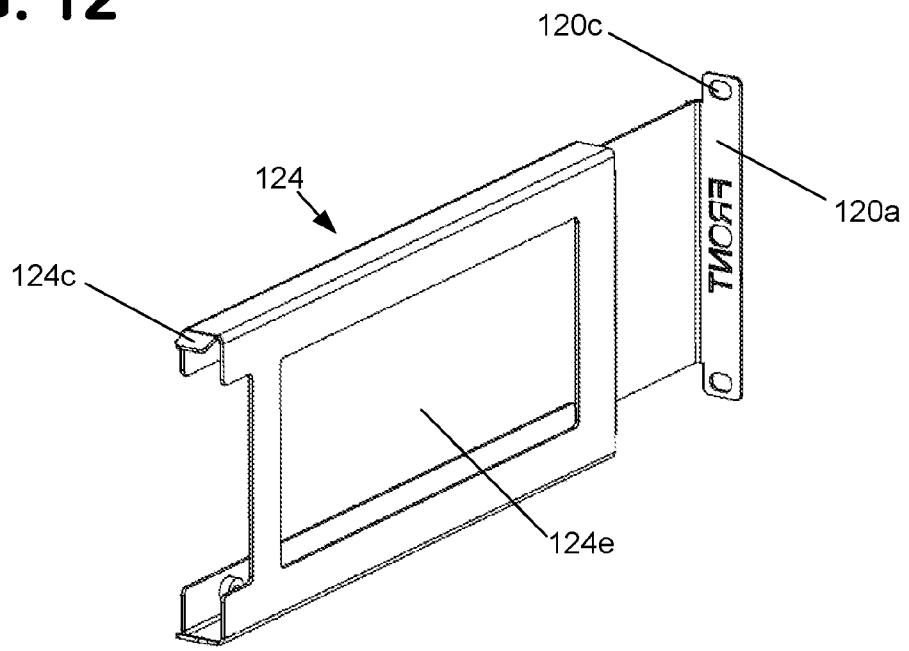
FIG. 12 is a front perspective view of the side bracket insert part shown in FIG. 11.
Figure 13:
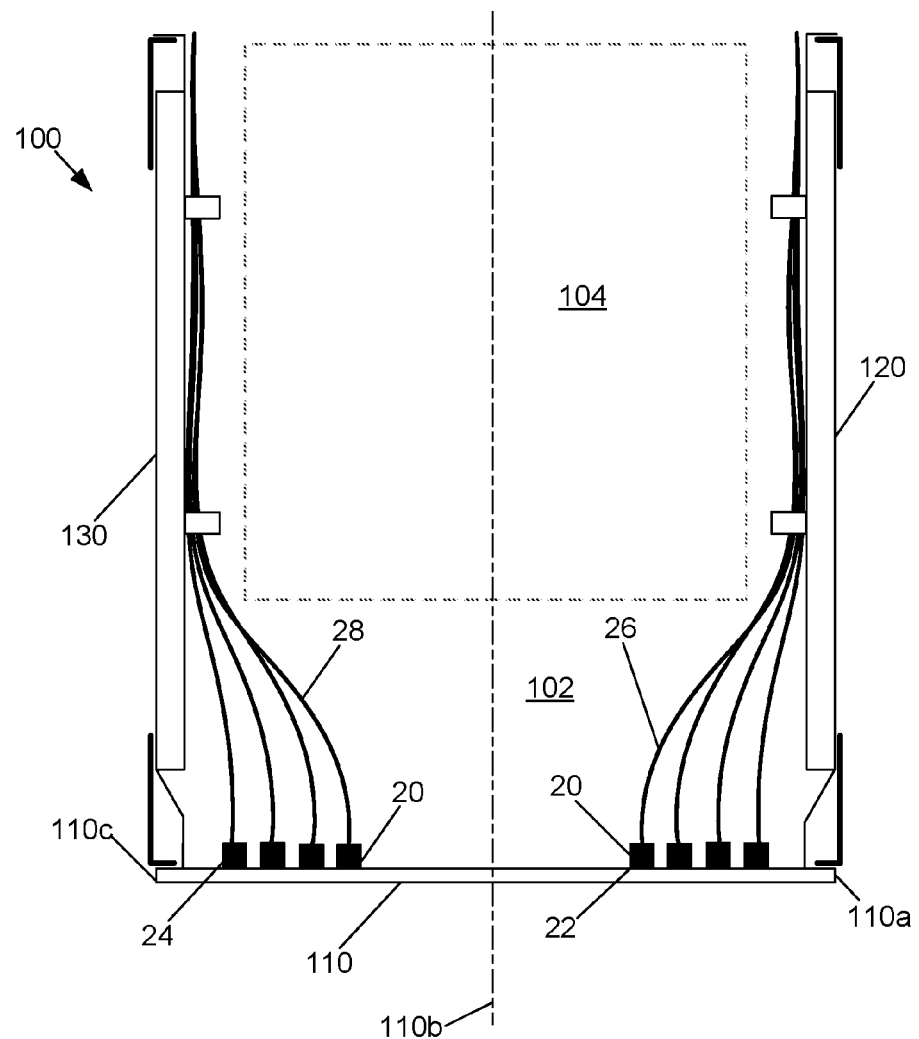
FIG. 13 is a schematic top view of a cable management assembly having features that are examples of aspects in accordance with the principles of the present disclosure showing a plurality of telecommunications cables supported by the assembly.
Figure 14:
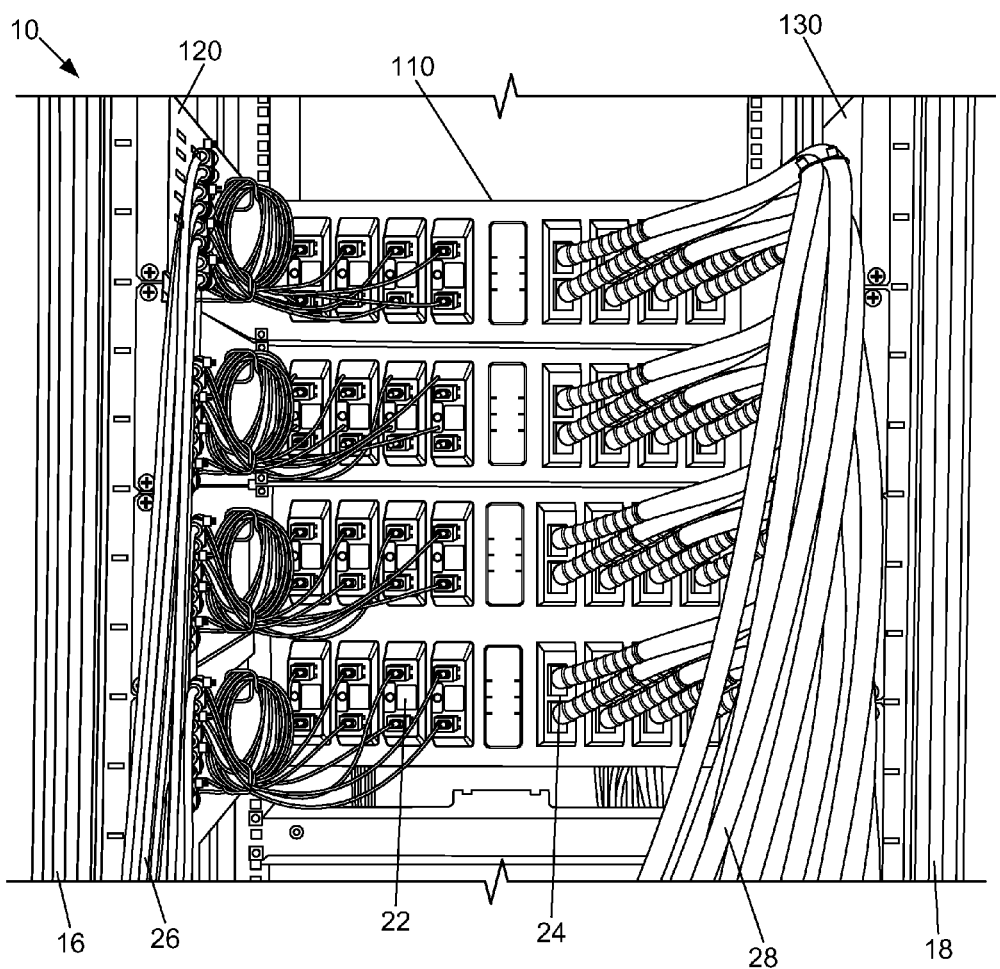
FIG. 14 is a photographic rear view of a cable management assembly having features that are examples of aspects in accordance with the principles of the present disclosure showing a plurality of telecommunications cables supported by the assembly.
Figure 15:
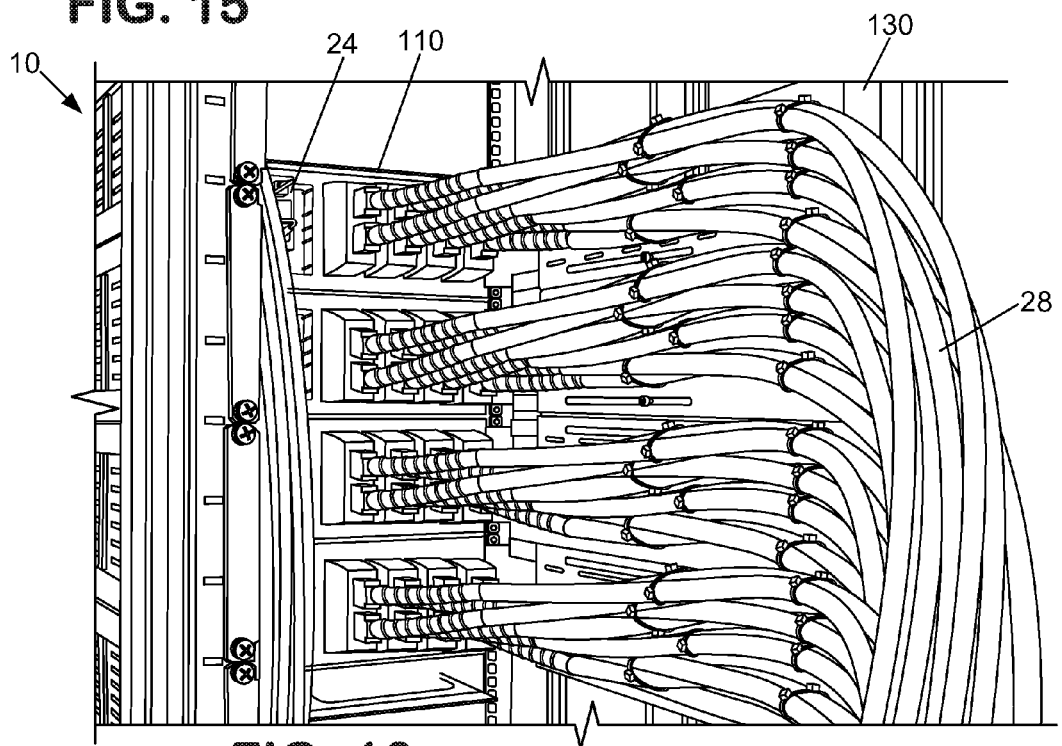
FIG. 15 is a photographic rear perspective view a portion of the cable management assembly of FIG. 14.
Figure 16:
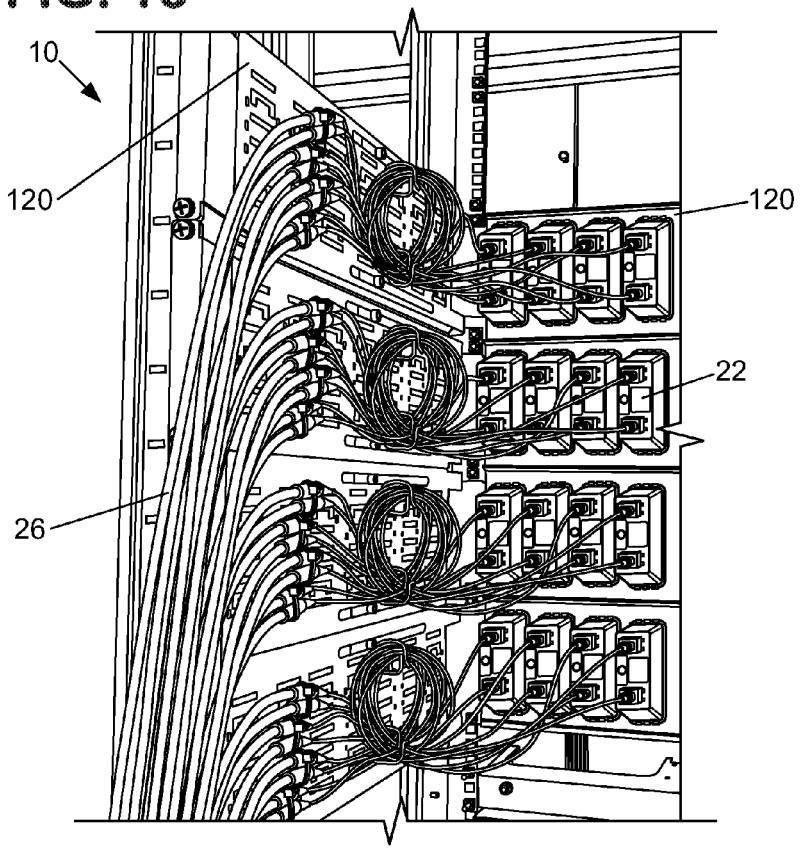
FIG. 16 is a photographic rear perspective view of a portion of the cable management assembly of FIG. 14.

The cable management assemblies 100 are each shown as being formed from a front plate 110, a first side bracket 120, and a second side bracket 130. In the configuration shown, the first and second side brackets 120, 130 are connected to the front plate 110 to form a generally U-shaped structure in which the brackets 120, 130 are generally parallel to each other and are generally orthogonal to the front plate 110. In the embodiment shown, the front plate 110 is mountable to the distribution frame 10 via mounting holes 12a, 14a in posts 12 and 14 while the first side bracket 120 is also mountable at the same location. As shown, the front plate 110 is disposed adjacent and between the posts 12, 14 and the side brackets 120, 130 at the mounting location. The first and second side brackets 120, 130 are also configured to engage with mounting holes 16a, 18a of posts 16 and 18 at the rear of the frame 10. In one installation procedure, the first and second side brackets 120, 130 are first mounted to posts 16, 18 and then mounted to posts 12, 14 in conjunction with the front plate 110. As shown, the front plate 110 has a height H, as indicated at FIG. 8. In the embodiment shown, the front plate 110 height H is three rack units or about 5 inches tall (about 132.7 mm tall). Other heights are possible.

As shown, the front plate 110 can be provided with a plurality of apertures 112 for receiving and supporting telecommunications components 20. In the embodiment shown, nine apertures 112 are provided in a single row and are for receiving telecommunications components 20. Where apertures 112 are not needed or desired, a cover member 114, for example a blind plate or filler, can be installed as is shown for the central aperture 112. One skilled in the art will understand that more or fewer apertures 112 may be provided and that each front plate 110 may be provided with a plurality of rows instead of one row.

Telecommunications components 20 can be, for example, pass through connectors, splitters, and cassettes. Where cassettes are used, they can be either copper-based such as an MRJ21 type cassette or fiber optic-based such as an MPO type cassette. The telecommunications components 20 and the front plate 110 can be configured together to form a patch panel. In the particular embodiment shown, the front plate 110 is provided with two different types of telecommunications components 20, however, it should be understood that the type of components 20 used can vary and be provided in various combinations as desired. Between a first end 110a of the front plate 110 and the intermediate point 110b of the front plate 110, four copper wire-based connector blocks 22 are provided, each of which has a field of jack receptacles 22a configured for receiving patch cords with corresponding plugs. Between a second end 110c and intermediate point 110b of the front plate 110, four fiber optic based adapter blocks 24 are provided, each of which has a field of adapters 24a configured for receiving patch cords with corresponding connectors. Other configurations are possible.

Referring to FIGS. 13-16, it can be seen how cables 26, 28 from the telecommunications components 20 may be routed within the distribution frame 10 and each cable management assembly 100. Generally, cables are routed from the connectors 22, 24 of the telecommunications components 20 laterally over to either the first side bracket 120 or to the second side bracket 130. As shown, copper based cables 26 are routed from the connectors 22 laterally over to the first side bracket 120 while fiber optic based cables 28 are routed from the connectors 24 laterally over to the second side bracket 130. As the cables are routed laterally to either one of the side brackets 120, 130, an open space 104 is created within the central region 102 of the cable management assembly 100. This open space 104 allows for a person to more easily access the side of the telecommunications components 20 that faces the central region 102 after cables have been installed. This is an improvement over systems having a back rack or shelf in which the cables are generally routed straight back from the front face to the rear of the distribution frame 10.

Still referring to FIGS. 13-16, it can be seen that each of the cables 26, 28 extend laterally away from and do not cross the intermediate line 110b. It should be understood that, although the intermediate line 110b is shown as being in the center of the front plate 110, the intermediate line 110b may exist anywhere between the first and seconds end 110a, 110c such that more cables are directed to one side bracket 120, 130 as compared to another. Likewise, cables may be routed laterally away from the intermediate point 110b over telecommunications components 20 to either the first side bracket 120 or the second side bracket 130 such that no cable crosses the intermediate point 110b. Additionally, it is noted that the cables 26, 28 could be routed to only one of the first and second side brackets 120, 130 as well, and an open space would still be formed. However, it is noted that the cables 26, 28 can be routed to either of the side brackets 120, 130 regardless of the location of the components 20 to which they are connected which could result in very little or no open space being present between the side brackets 120, 130.

As shown, the front plate 110 is also provided with a plurality of mounting holes 116 for securing the front plate 110 to the distribution frame 10. In the configuration presented, the front plate mounting holes 116 align with mounting holes 12a, 14a on posts 12, 14, respectively. Fasteners (now shown) can be provided to fully secure the front plate 110 to the distribution frame 10.

Referring to FIGS. 3-12, the first and second side brackets 120, 130 will be described in further detail. It is noted that the first and second side brackets 120, 130 are mirror images of each other, but are otherwise similar. However, it should be understood that the brackets 120, 130 do not necessarily need to be the same in all respects. The following description, at certain points, refers to a side bracket 120, 130. Where this is the case, it should be understood that the described features apply to both the first side bracket 120 and the second side bracket 130.

As shown the side bracket 120, 130 extends between a first end 120a, 130a and a second end 120b, 130b. The first end 120a, 130a is shown as being provided with apertures 120c, 130c such that the first end 120a, 130a can be mounted to the distribution frame 10 and/or to the front plate 110. The second end 120b, 130b is shown as being provided with apertures 120d, 130d such that the second end 120b, 130b can be mounted to the distribution frame 10.

Figure 6:
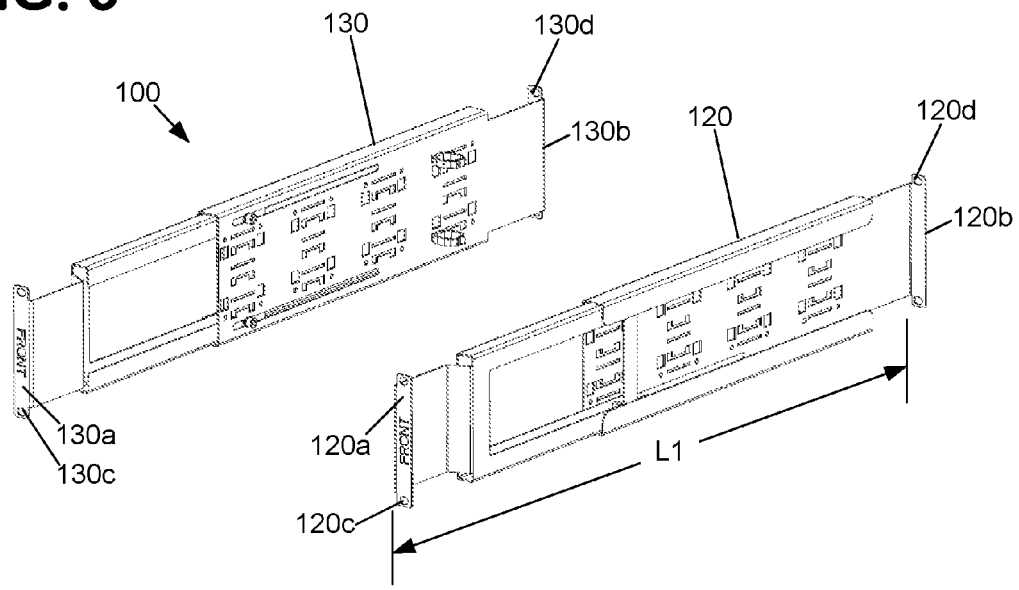
FIG. 6 is a front perspective view of the side brackets of the cable management assembly shown in FIG. 3 separated from the front frame section wherein the side brackets are in a maximum extension position.
Figure 7:
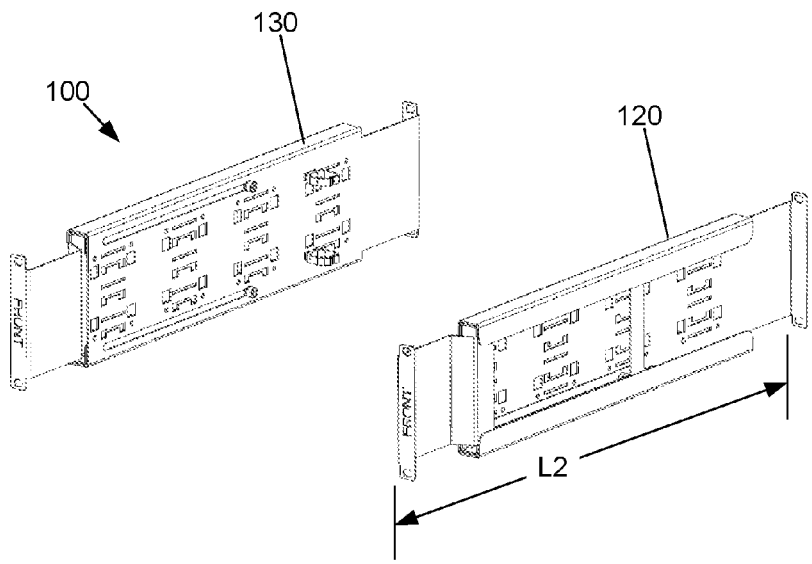
FIG. 7 is a front perspective view of the side brackets of the cable management assembly shown in FIG. 3 separated from the front frame section wherein the side brackets are in a minimum extension position.

In the embodiment shown, the side bracket 120, 130 has an adjustable length and can extend between a maximum length L1, as shown at FIG. 6, and a minimum length L2, as shown at FIG. 7. The extendable nature of the side bracket 120, 130 allows for the cable management assembly 100 to be installed in different cabinets having various depths without requiring a differently sized side bracket 120, 130. In the embodiment shown, the side bracket 120, 130, and thus the cable management assembly 100, has a minimum length L2 of about 600 mm and a maximum length L1 of about 820 mm and is positionable at any length there between.

In order to allow the side bracket 120, 130 to be extendable, the side bracket 120, 130 may be formed from a sleeve part 122, 132 and an insert part 124, 134. As shown, the insert part 124, 134 is received by and slidable within the sleeve part 122, 132. In one embodiment, the sleeve part 122, 132 is provided with an upper channel 122a, 132a and a lower channel 122b, 132b. The insert part 124, 134 may also be provided with an upper channel 124a, 134a and a lower channel 124b, 134b that slidably engage with the sleeve part 122, 132 channels. To make the insert part 124, 134 easier to initially slide into the sleeve part 122, 132, the upper channel 124a, 134a may be provided with a sloped tab 124c.

The side bracket 120, 130 may also be provided with an arrangement for guiding purposes, for limiting the maximum and minimum extension lengths, and for locking the side bracket 120, 130 at a fixed length. As shown, the sleeve part 122, 132 is provided with a pair of longitudinal slots 122c, each of which is oriented over a fastener connection 124d, 134d on the insert part 124, 134. A fastener 126, 136 may be provided that can be threaded into the fastener connection 124d, 134d and tightened to prevent the sleeve part 122, 132 from sliding relative to the insert part 124, 134.

The side bracket 120, 130 is also configured with a plurality of aperture arrangements 122d for retaining cable mounting accessories 140. The cable mounting accessories 140 are for retaining the cables 26, 28 along the side brackets 120, 130. Non-limiting examples of cable mounting accessories are clips, saddles cable ties, and Velcro ties or straps. In the embodiment shown, cable mounting accessories 140 are optical fiber network saddles. The cable mounting accessories 140 can be configured to support the cables in many ways, for example, accessories 140 can be used to support generally straight segments of cable, slack loops, and/or cables at fan-out or break-out locations (and the individual cables extending therefrom). The aperture arrangements 122d are shown as being located on the sleeve part 122, 132 and include a plurality of openings to accommodate a wide range of possible mounting accessories. To ensure access can be provided on both sides of the aperture arrangements 122d, the insert part 124, 134 is shown as being provided with an open portion 124e, 134e. It is noted that the aperture arrangements 122d could also be located on the insert part in addition to or instead of the arrangements 122d being located on the sleeve part 122, 132.

The above specification, examples and data provide a complete description of the manufacture and use of the composition of the invention. Since many embodiments of the invention can be made without departing from the spirit and scope of the invention, the invention resides in the claims hereinafter appended.

DRAWING LIST 10 distribution frame
10a front side
10b back side
10c first side
10d second side
10e top
10f bottom
12 first post
12a mounting holes
14 second post
14a mounting holes
16 third post
16a mounting holes 18 fourth post
18a mounting holes
20 telecommunications components
22 Cu connectors
22a Cu jacks
24 Fiber connectors
24a adapters
26 copper cables
28 fiber optic cables
100 cable management assembly
102 central region
104 open space
110 front plate
110a first end
110b intermediate point
110c second end
112 apertures
114 cover
116 mounting holes
120 first side bracket
120a first end
120b second end
120c apertures at first end
120d apertures at second end
122 sleeve part
122a upper channel
122b lower channel
122c longitudinal slot
122d aperture arrangement
124 insert part
124a upper channel
124b lower channel
124c sloped tab
124d fastener connection
124e open portion
126 lock nut
130 second side bracket
130a first end
130b second end
130c apertures at first end
130d apertures at second end
132 sleeve part
132a upper channel
132b lower channel
132c longitudinal slot
132d aperture arrangement
134 insert part
134a upper channel
134b lower channel
134c sloped tab
134d fastener connection
134e open portion
136 lock nut
140 cable mounting accessories
142 vertical cable management accessory

What is claimed is:

1. A telecommunications system (10) comprising:
a. a distribution frame (10) having a front (10a) and a back (10b);
b. a plurality of cable management assemblies (100) mounted to the frame (10), each of the cable management assemblies (100) comprising:
i a front plate (110) extending between a first end (110a) and a second end (110c) and being provided with apertures (112), the front plate (110) being mounted to the front (10a) of the frame (10);
ii a plurality of telecommunications components (20), each of which being installed within one of the apertures (112) of the front plate (110);
iii a first side bracket (120) extending between a front end (120a) and a back end (120b), the first side bracket front end (120a) being mounted to the front (10a) of the frame (10) adjacent the first end (110a) of the front plate (110), the first side bracket back end (120b) being mounted to the back (10b) of the frame (10), the first side bracket (120)
iv a first plurality of cables (26) extending from at least some of the telecommunications components mounted to the front plate (110) and over to the first side bracket (120), wherein the first plurality of cables (26) is supported along a length (L2) of the first side bracket (120);
v a second side bracket (130) extending between a front end (130a) and a back end (130b), the second side bracket front end (130a) being mounted to the front (10a) of the frame (10) adjacent the second end (110c) of the front plate (110), the second side bracket back end (130b) being mounted to the back of the frame (10), the second side bracket (130); and
vi a second plurality of cables (28) extending from at least some of the telecommunications components (20) mounted to the front plate (110) and over to the second side bracket (130), wherein the second plurality of cables (28) is supported along a length (L2) of the second side bracket (130);
vii wherein the cable management assembly has open back, top, and bottom sides, and wherein the first plurality of cables (26) are spaced apart and separated from the second plurality of cables (28) to define an open space (104) within a central region (102) between the first and second side brackets (120, 130), the open space (104) having a dimension that is a majority of a distance between the first and second side brackets (120, 130).

2. The telecommunications system (10) of claim 1, wherein the the plurality of cable management assemblies (100) includes at least four cable management assemblies (100).

3. The telecommunications system (10) of claim 2, further comprising a vertical cable management accessory (142) mounted to the front (10a) of the frame (10) and located below the cable management assemblies (100), the vertical cable management accessory (142) being for routing cables from the telecommunications components (20) to active equipment supported by the frame (10).

4. The telecommunications system (10) of claim 1, further comprising:
a. a first connector (20) mounted in one of the apertures (112) of the front plate (110);
b. a first cable mounting accessory (140) mounted to the first side bracket (120); and
c. a first cable (26) connected to the first connector (20) and extending laterally from the first connector (20) to the first side bracket (120), the first cable (26) extending along a length (L) of the first side bracket (120) and being supported by the first cable mounting accessory (140).

5. The telecommunications system (10) of claim 4, further comprising:
a. a second connector (20) mounted in one of the apertures (112) of the front plate (110);
b. a second cable mounting accessory (140) mounted to the second side bracket (130); and c. a second cable (28) connected to the second connector (20) and extending laterally from the second connector (20) to the second side bracket (130), the second cable (28) extending along a length (L) of the second side bracket (130) and being supported by the second cable mounting accessory (140).

6. The telecommunications system (10) of claim 1, wherein the first and second side brackets (120, 130) each have an extendable length (L).

7. The telecommunications system (10) of claim 6, wherein each of the first and second side brackets (120, 130) include:
  a. a sleeve part (122, 132); and
  b. an insert part (124, 134) received within the sleeve part (122, 132);
  c. wherein the insert part (124, 134) is slidable within the sleeve part (122, 132).

8. The telecommunications system (10) of claim 7 wherein each of the first and second side brackets (120, 130) further include a locking mechanism (124*d*, 126) for fixing the position of the insert part (124, 134) within the sleeve part (122, 132).

9. The telecommunications system (10) of claim 7, wherein at least one of the sleeve part (122, 132) and the insert part (124, 134) have a plurality of aperture arrangements (122*d*) for receiving and retaining cable mounting accessories (140).

10. The telecommunications system (10) of claim 9, wherein the plurality of aperture arrangements (122*d*) are present on the sleeve part (122, 132) of each of the first and second side brackets (120, 130).

\* \* \* \* \*

UNITED STATES PATENT AND TRADEMARK OFFICE
CERTIFICATE OF CORRECTION

| | | |
|---|---|---|
| PATENT NO. | : 9,817,202 B2 | Page 1 of 1 |
| APPLICATION NO. | : 15/162191 | |
| DATED | : November 14, 2017 | |
| INVENTOR(S) | : Danny Ghislain Thijs et al. | |

It is certified that error appears in the above-identified patent and that said Letters Patent is hereby corrected as shown below:

On the Title Page

Item (63): "Pat. No. 9,348,014." should read --Pat. No. 9,348,104.--

In the Claims

Column 8, Line 10, Claim 1: "side bracket (120)" should read --side bracket (120);--

Column 8, Line 40, Claim 2: "wherein the the plurality" should read --wherein the plurality--

Signed and Sealed this
Twenty-seventh Day of April, 2021

Drew Hirshfeld
*Performing the Functions and Duties of the*
*Under Secretary of Commerce for Intellectual Property and*
*Director of the United States Patent and Trademark Office*